United States Patent
Chen et al.

(10) Patent No.: US 11,244,624 B2
(45) Date of Patent: Feb. 8, 2022

(54) PIXEL CIRCUIT AND DRIVING METHOD THEREFOR, DISPLAY SUBSTRATE AND DISPLAY DEVICE

(71) Applicants: CHONGQING BOE OPTOELECTRONICS TECHNOLOGY CO., LTD., Chongqing (CN); BOE TECHNOLOGY GROUP CO., LTD., Beijing (CN)

(72) Inventors: Shuai Chen, Beijing (CN); Xiuzhu Tang, Beijing (CN); Zhi Zhang, Beijing (CN); Fengwei Liu, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/256,705

(22) PCT Filed: Apr. 21, 2020

(86) PCT No.: PCT/CN2020/085768
§ 371 (c)(1),
(2) Date: Dec. 29, 2020

(87) PCT Pub. No.: WO2020/216201
PCT Pub. Date: Oct. 29, 2020

(65) Prior Publication Data
US 2021/0256910 A1    Aug. 19, 2021

(30) Foreign Application Priority Data

Apr. 22, 2019 (CN) .......................... 201910323658.9

(51) Int. Cl.
*G09G 3/3258* (2016.01)
*G09G 3/3266* (2016.01)
(Continued)

(52) U.S. Cl.
CPC ......... *G09G 3/3258* (2013.01); *G09G 3/3266* (2013.01); *G09G 3/3275* (2013.01); *H01L 27/3265* (2013.01); *G09G 2300/0426* (2013.01)

(58) Field of Classification Search
None
See application file for complete search history.

(56) References Cited

U.S. PATENT DOCUMENTS

2014/0160185 A1* 6/2014 Okuno ................ G09G 3/3233
                                                          345/691
2014/0306946 A1   10/2014 Senda
(Continued)

FOREIGN PATENT DOCUMENTS

CN      203179479 U      9/2013
CN      105355170 A      2/2016
(Continued)

OTHER PUBLICATIONS

First office action of Chinese application No. 201910323658.9 dated May 7, 2020.
(Continued)

*Primary Examiner* — Nitin Patel
*Assistant Examiner* — Amen W Bogale
(74) *Attorney, Agent, or Firm* — Fay Sharpe LLP

(57) ABSTRACT

A pixel circuit and a driving method therefor, a display substrate, and a display device are provided. The pixel circuit includes: a light-emitting control circuit, used to control a potential of a first node in response to a first scan signal from a first scan signal terminal and a data signal from a data signal terminal, output a direct current power signal provided by a direct current power terminal to a second node in response to a light-emitting control signal from a light-emitting control signal terminal, and control switching-on and switching-off between a third node and a light-emitting element; a compensation circuit, used to adjust the potential of the first node according to a potential of the second node;
(Continued)

and a driving circuit, used to output a driving signal to the third node in response to the potential of the first node and the potential of the second node.

20 Claims, 10 Drawing Sheets

(51) Int. Cl.
G09G 3/3275 (2016.01)
H01L 27/32 (2006.01)

(56) References Cited

U.S. PATENT DOCUMENTS

2018/0308427 A1* 10/2018 Zhang ................... H01L 27/124
2019/0057651 A1*  2/2019 Li ........................ G09G 3/3233
2019/0156750 A1*  5/2019 Dong .................. H01L 27/3276

FOREIGN PATENT DOCUMENTS

| CN | 105590955 A | 5/2016 |
| CN | 106128360 A | 11/2016 |
| CN | 106652904 A | 5/2017 |
| CN | 107086024 A | 8/2017 |
| CN | 107342048 A | 11/2017 |
| CN | 108877667 A | 11/2018 |
| CN | 109087609 A | 12/2018 |
| CN | 109559686 A | 4/2019 |
| CN | 110010076 A | 7/2019 |

OTHER PUBLICATIONS

Notification to grant patent right for invention of Chinese application No. 201910323658.9 dated Sep. 29, 2020.

* cited by examiner

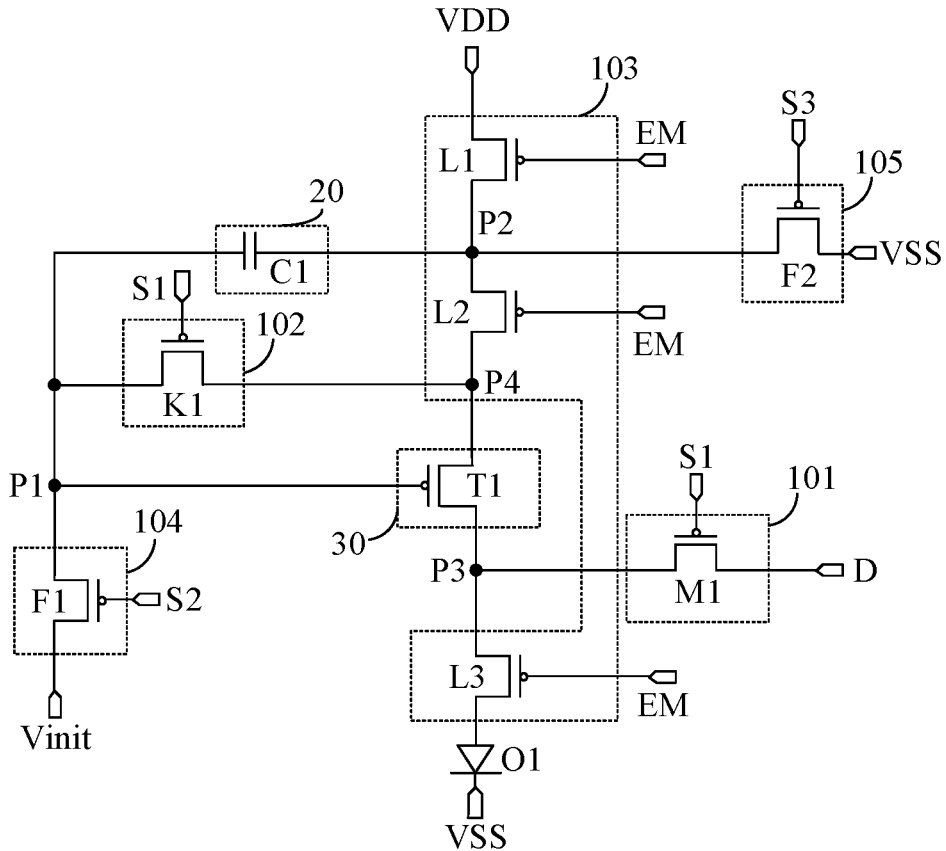

FIG. 6

| In a data writing stage, the potential of a first scan signal provided by a first scan signal terminal being a first potential, controlling, by a light-emitting control circuit, a potential of a first node according to a data signal provided by a data signal terminal in response to the first scan signal | 401 |

| In a light-emitting stage, the potential of a light-emitting control signal provided by a light-emitting control signal terminal being the first potential, outputting, by the light-emitting control circuit, a direct current power signal provided by a direct current power terminal to a second node in response to the light-emitting control signal, and controlling a third node to be conductive with a light-emitting element, adjusting, by a compensation circuit, the potential of the first node according to a potential of the second node, and outputting, by a driving circuit, a driving signal to the third node in response to the potential of the first node and the potential of the second node | 402 |

FIG. 7

PIXEL CIRCUIT AND DRIVING METHOD THEREFOR, DISPLAY SUBSTRATE AND DISPLAY DEVICE

CROSS-REFERENCE TO RELATED APPLICATIONS

The present disclosure is a 371 of PCT Patent Application Serial No. PCT/CN2020/085768, filed on Apr. 21, 2020, which claims priority to Chinese Patent Application No. 201910323658.9, filed on Apr. 22, 2019 and entitled "PIXEL CIRCUIT AND DRIVE METHOD THEREFOR, DISPLAY SUBSTRATE AND DISPLAY APPARATUS", the entire contents of which are incorporated herein by reference.

TECHNICAL FIELD

The present disclosure relates to the field of display technologies and, particularly, relates to a pixel circuit and a driving method therefor, a display substrate and a display device.

BACKGROUND

The organic light emitting diode (OLED), as a current-type light-emitting device, is increasingly used in high-performance display panels due to its characteristics of low energy consumption, self-luminescence, fast response, wide viewing angle and the like.

In related arts, an OLED display panel includes pixel units arranged in an array, and each pixel unit includes a switching transistor, a driving transistor, and an OLED. The switching transistor can output a data signal provided by a data signal terminal to the driving transistor. The driving transistor can output a driving current to the OLED according to a direct current power signal provided by a direct current power terminal and the data signal, so as to drive the OLED to emit light.

SUMMARY

The present disclosure provides a pixel circuit and a driving method therefor, a display substrate, and a display device.

In one aspect, there is provided a pixel circuit, including: a light-emitting control circuit, a compensation circuit and a driving circuit; wherein the light-emitting control circuit is respectively connected to a first scan signal terminal, a light-emitting control signal terminal, a data signal terminal, a direct current power terminal, a first node, a second node, a third node, and a light-emitting element, and the light-emitting control circuit is used to control a potential of the first node in response to a first scan signal from the first scan signal terminal and a data signal from the data signal terminal, output a direct current power signal provided by the direct current power terminal to the second node in response to a light-emitting control signal from the light-emitting control signal terminal, and control switching-on and switching-off between the third node and the light-emitting element;

the compensation circuit is respectively connected to the first node and the second node, and the compensation circuit is used to adjust the potential of the first node according to a potential of the second node; and the driving circuit is respectively connected to the first node, the second node, and the third node, and the driving circuit is used to output a driving signal to the third node in response to the potential of the first node and the potential of the second node.

Optionally, the compensation circuit includes: a storage capacitor; and one end of the storage capacitor is connected to the first node, and the other end of the storage capacitor is connected to the second node.

Optionally, the driving circuit includes: a driving transistor; and a gate of the driving transistor is connected to the first node, a first electrode of the driving transistor is connected to the second node, and a second electrode of the driving transistor is connected to the third node.

Optionally, the light-emitting control circuit includes: a data writing sub-circuit, a compensation sub-circuit and a light-emitting control sub-circuit;

the data writing sub-circuit is respectively connected to the first scan signal terminal, the data signal terminal and the third node, and the data writing sub-circuit is used to output the data signal to the third node in response to the first scan signal;

the compensation sub-circuit is respectively connected to the first scan signal terminal, the first node and a fourth node, the compensation sub-circuit is used to control switching-on and switching-off between the first node and the fourth node in response to the second scan signal, and the fourth node is also connected to a first electrode of the driving transistor in the driving circuit; and the light-emitting control sub-circuit is respectively connected to the light-emitting control signal terminal, the direct current power terminal, the second node, the fourth node, the third node and the light-emitting element, and the light-emitting control sub-circuit is used to output the direct current power signal to the second node in response to the light-emitting control signal, control switching-on and switching-off between the second node and the fourth node, and control switching-on and switching-off between the third node and the light-emitting element.

Optionally, the data writing sub-circuit includes: a data writing transistor; and a gate of the data writing transistor is connected to the first scan signal terminal, a first electrode of the data writing transistor is connected to the data signal terminal, and a second electrode of the data writing transistor is connected to the third node.

Optionally, the compensation sub-circuit includes: a compensation transistor; and a gate of the compensation transistor is connected to the first scan signal terminal, a first electrode of the compensation transistor is connected to the first node, and a second electrode of the compensation transistor is connected to the fourth node.

Optionally, the light-emitting control sub-circuit includes: a first light-emitting control transistor, a second light-emitting control transistor, and a third light-emitting control transistor;

a gate of the first light-emitting control transistor is connected to the light-emitting control signal terminal, a first electrode of the first light-emitting control transistor is connected to the direct current power terminal, and a second electrode of the first light-emitting control transistor is connected to the second node;

a gate of the second light-emitting control transistor is connected to the light-emitting control signal terminal, a first electrode of the second light-emitting control transistor is connected to the second node, and a second electrode of the second light-emitting control transistor is connected to the fourth node; and a gate of the third light-emitting control transistor is connected to the light-emitting control signal terminal, a first electrode of the third light-emitting control transistor is connected to the third node, and a second electrode of the third light-emitting control transistor is connected to the light-emitting element.

Optionally, the light-emitting control circuit further includes: a first reset sub-circuit and a second reset sub-circuit;

the first reset sub-circuit is respectively connected to a second scan signal terminal, an initial power terminal and the first node, and the reset sub-circuit is used to output an initial power signal provided by the initial power terminal to the first node in response to a second scan signal from the second scan signal terminal; and the second reset sub-circuit is respectively connected to the second node, a third scan signal terminal and a reset power terminal, and the second reset sub-circuit is used to output a reset power signal provided by the reset power terminal to the second node in response to a third scan signal from the third scan signal terminal.

Optionally, the first reset sub-circuit includes: a first reset transistor;

a gate of the first reset transistor is connected to the second scan signal terminal, a first electrode of the first reset transistor is connected to the initial power terminal, and a second electrode of the first reset transistor is connected to the first node.

Optionally, the second reset sub-circuit includes: a second reset transistor; and a gate of the second reset transistor is connected to the third scan signal terminal, a first electrode of the second reset transistor is connected to the reset power terminal, and a second electrode of the second reset transistor is connected to the second node.

Optionally, the transistors included in the pixel circuit are P-type transistors.

In another aspect, there is provided a driving method for a pixel circuit, and the method is applied to the pixel circuit according to the above aspect and includes:

in a data writing stage, the potential of a first scan signal provided by a first scan signal terminal being a first potential, controlling, by a light-emitting control circuit, a potential of a first node according to a data signal provided by a data signal terminal in response to the first scan signal; and in a light-emitting stage, the potential of a light-emitting control signal provided by a light-emitting control signal terminal being the first potential, outputting, by the light-emitting control circuit, a direct current power signal provided by a direct current power terminal to a second node in response to the light-emitting control signal, and controlling a third node to be conductive with a light-emitting element, adjusting, by a compensation circuit, the potential of the first node according to a potential of the second node, and outputting, by a driving circuit, a driving signal to the third node in response to the potential of the first node and the potential of the second node.

Optionally, the light-emitting control circuit includes: a data writing sub-circuit, a compensation sub-circuit and a light-emitting control sub-circuit;

in the data writing stage, the potential of the first scan signal is the first potential, and the data signal terminal outputs the data signal to the first node through the data writing sub-circuit, the driving circuit and the compensation sub-circuit; and in the light-emitting stage, the potential of the light-emitting control signal is the first potential, the direct current power terminal outputs the direct current power signal to the second node through the light-emitting control sub-circuit, and the third node is conductive with the light-emitting element.

Optionally, the light-emitting control circuit further includes: a first reset sub-circuit and a second reset sub-circuit, the first reset sub-circuit is respectively connected to a second scan signal terminal, an initial power terminal and the first node, and the second reset sub-circuit is respectively connected to the second node, a third scan signal terminal and a reset power terminal; before the data writing stage, the method further includes:

in a reset stage, the potential of a second scan signal provided by the second scan signal terminal and the potential of a third scan signal provided by the third scan signal terminal being both the first potential, outputting, by the first reset sub-circuit, an initial power signal provided by the initial power terminal to the first node in response to the second scan signal, and outputting, by the second reset sub-circuit, a reset power signal provided by the reset power terminal to the second node in response to the third scan signal, wherein a potential of the initial power signal is the first potential; and in the data writing stage, the potential of the third scan signal provided by the third scan signal terminal being the first potential, outputting, by the second reset sub-circuit, the reset power signal to the second node in response to the third scan signal.

Optionally, a potential of the direct current power signal is a second potential, and the second potential is a high potential relative to the first potential.

In yet another aspect, there is provided a display substrate, including: a plurality of pixel units, and in the plurality of pixel units, each of at least one of the pixel units includes: a light-emitting element, and the pixel circuit according to the above aspect connected to the light-emitting element.

Optionally, each of the pixel units includes: a light-emitting element, and the pixel circuit according to the above aspect connected to the light-emitting element.

Optionally, the light-emitting element is an organic light-emitting diode.

In still another aspect, there is provided a display device including: a driving circuit, and the display substrate according to the above aspect.

BRIEF DESCRIPTION OF DRAWINGS

FIG. 6 is a schematic structural diagram of yet still another pixel circuit according to an embodiment of the present disclosure;

FIG. 7 is a flowchart of a driving method for a pixel circuit according to an embodiment of the present disclosure;

DESCRIPTION OF EMBODIMENTS

Figure 1:
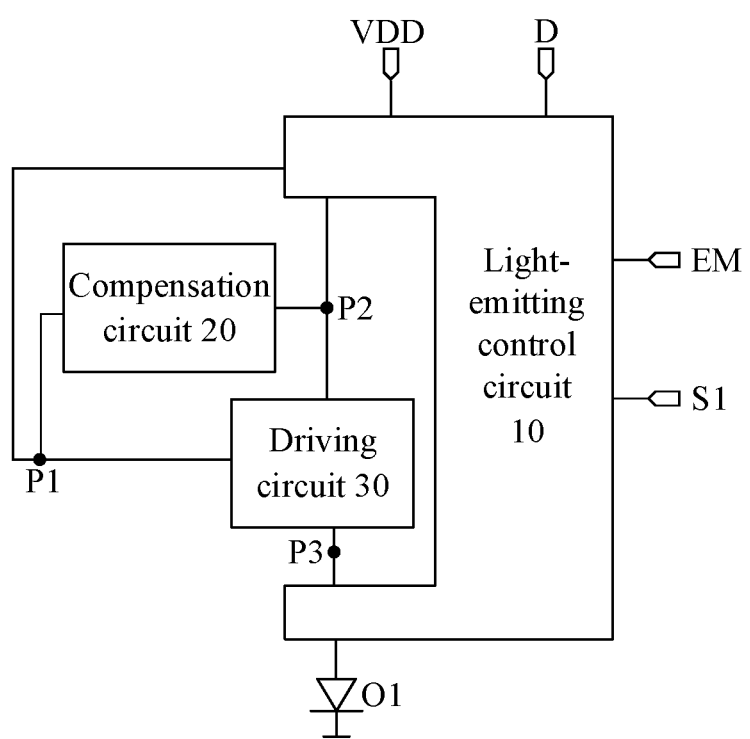
FIG. 1 is a schematic structural diagram of a pixel circuit according to an embodiment of the present disclosure.

To make the objectives, technical solutions and advantages of the present disclosure clearer, the followings will describe the embodiments of the present disclosure in detail with reference to the drawings.

Transistors used in all the embodiments of the present disclosure may be thin film transistors or field-effect transistors or other devices with the same characteristics. The transistors used in the embodiments of the present disclosure are mainly switching transistors according to the functions in the circuit. Since a source and a drain of the switching transistor used here are symmetrical, the source and the drain are interchangeable. In the embodiments of the present disclosure, the source is referred to as a first electrode and the drain is referred to as a second electrode, or the drain is referred to as a first electrode and the source is referred to as a second electrode. According to the form in the drawings, an intermediate terminal of the transistor is a gate, a signal input terminal is the source, and a signal output terminal is the drain. The switching transistors used in the embodiments of the present disclosure may be P-type switching transistors. The P-type switching transistor is switched on when the gate is at a low level and is switched off when the gate is at a high level. In addition, each of a plurality of signals in various embodiments of the present disclosure corresponds to a first potential and a second potential. The first potential and the second potential only represent that the signal has potentials with two different state quantities, and do not represent that the first potential or the second potential has a specific value in the whole text.

In related arts, multiple pixel units included in an OLED display panel may all be connected to the same direct current power terminal, that is, one direct current power terminal can drive the entire OLED display panel. When the size of the OLED display panel is larger (that is, the number of pixel units included in the OLED display panel is larger), the number of pixel units that need to be driven by one direct current power terminal is larger, and a signal wire disposed for the direct current power terminal will be longer. Due to the impact of a parasitic capacitance on the signal wire, the potential of a direct current power signal provided by the direct current power terminal may continue to decrease with the extension of the signal wire, that is, the direct current power signal will cause a voltage drop problem. In addition, the threshold voltage of a driving transistor included in each pixel unit may be different due to the process, materials and other factors when the transistor is prepared, and the threshold voltage of each driving transistor may drift to different degrees as the use time increases.

A driving current output by the driving transistor to the OLED is related to both the potential of the direct current power signal provided by the direct current power terminal and the threshold voltage of the driving transistor, so that due to the voltage drop of the direct current power signal, the threshold voltage drift of the driving transistor and other factors, a difference in the driving currents output by the driving transistors in respective pixel units may be caused, which further leads to a poor display brightness uniformity of the OLED display panel and a poor display effect.

The embodiment of the present disclosure provides a pixel circuit, which can solve the problem of poor display brightness uniformity and a poor display effect of the OLED display panel in related arts. FIG. 1 is a schematic structural diagram of a pixel circuit according to an embodiment of the present disclosure. As shown in FIG. 1, the pixel circuit may include: a light-emitting control circuit 10, a compensation circuit 20 and a driving circuit 30.

The light-emitting control circuit 10 may be respectively connected to a first scan signal terminal S1, a light-emitting control signal terminal EM, a data signal terminal D, a direct current power terminal VDD, a first node P1, a second node P2, a third node P3 and a light-emitting element O1. The light-emitting control circuit 10 may control a potential of the first node P1 in response to a first scan signal from the first scan signal terminal S1 and a data signal from the data signal terminal D. The light-emitting control circuit 10 may also output a direct current power signal provided by the direct current power terminal VDD to the second node P2 in response to a light-emitting control signal from the light-emitting control signal terminal EM, and control switching-on and switching-off between the third node P3 and the light-emitting element O1.

Exemplarily, the light-emitting control circuit 10 may control the potential of the first node P1 according to the data signal provided by the data signal terminal D when the potential of the first scan signal provided by the first scan signal terminal S1 is a first potential, for example, the light-emitting control circuit 10 may output the data signal to the first node P1. The light-emitting control circuit 10 may also output the direct current power signal provided by the direct current power terminal VDD to the second node P2 when the potential of the light-emitting control signal provided by the light-emitting control signal terminal EM is the first potential, and control the third node P3 to be conductive with the light-emitting element O1.

In the embodiment of the present disclosure, a potential of the direct current power signal may be a second potential, and the second potential may be a high potential relative to the first potential.

The compensation circuit 20 may be connected to the first node P1 and the second node P2 respectively. The compensation circuit 20 may adjust the potential of the first node P1 according to a potential of the second node P2.

Exemplarily, the compensation circuit 20 may adjust the potential of the first node P1 according to the potential of the second node P2 through a coupling effect (that is, the characteristic that the potential difference between the two terminals of the compensation circuit 20 cannot change suddenly).

In the embodiment of the present disclosure, the light-emitting control circuit 10 may output the direct current power signal to the second node P2 when the potential of the light-emitting control signal is the first potential, that is, when the OLED is driven to emit light, and control the third node P3 to be conductive with the light-emitting element O1. Therefore, when the OLED is driven to emit light, the potential of the second node P2 is the potential of the direct current power signal, and a potential of the third node P3 is a potential of an anode of the light-emitting element O1.

The driving circuit 30 may be connected to the first node P1, the second node P2, and the third node P3 respectively. The driving circuit 30 may output a driving signal to the third node P3 in response to the potential of the first node P1 and the potential of the second node P2.

Exemplarily, the driving circuit 30 may output the driving signal to the third node P3 according to the potential of the first node P1 and the potential of the second node P2 when the potential of the first node P1 is the first potential, and the driving signal is a signal for driving the light-emitting element O1 to emit light.

The driving signal output by the driving circuit 30 is related to a potential difference between the first node P1 and the second node P2, so that the compensation circuit 20 adjusts the potential of the first node P1 based on the potential of the second node P2, and the driving signal output by the driving circuit 30 is independent of the potential of the second node P2. In addition, the potential of the second node P2 is the potential of the direct current power signal, so that the driving signal output by the driving circuit 30 to the light-emitting element O1 is independent of the potential of the direct current power signal, thereby further solving the problem of uneven brightness of the display panel caused by a voltage drop of the direct current power terminal.

In summary, the embodiment of the present disclosure provides a pixel circuit. The pixel circuit includes the light-emitting control circuit, the compensation circuit, and the driving circuit. The light-emitting control circuit can output the direct current power signal provided by the direct current power terminal to the second node, and control the third node to be conductive with the light-emitting element, and the compensation circuit can adjust the potential of the first node according to the potential of the second node. Therefore, when the pixel circuit is driven, the potential finally written to the first node is only related to a threshold voltage of the driving transistor, the potential of the data signal provided by the data signal terminal, and the potential of the second node. Moreover, the driving signal output by the driving circuit is related to the potential difference between the first node and the second node, so that the driving signal output by the driving circuit is independent of the potential of the second node, that is, independent of the direct current power signal, thereby avoiding the problem of uneven display brightness of the display panel due to the voltage drop at the direct current power terminal. The pixel circuit provided by the embodiment of the present disclosure can ensure a better display effect of the display panel.

In addition, in the embodiment of the present disclosure, the potential finally written to the first node by the light-emitting control circuit is also related to the threshold voltage of the driving transistor, so that the driving signal output by the driving circuit is independent of the threshold voltage of the driving transistor. Therefore, the problem of uneven display brightness due to different or drifting threshold voltages of the driving transistors can be avoided, and the display effect of the display panel is further ensured.

Figure 2:
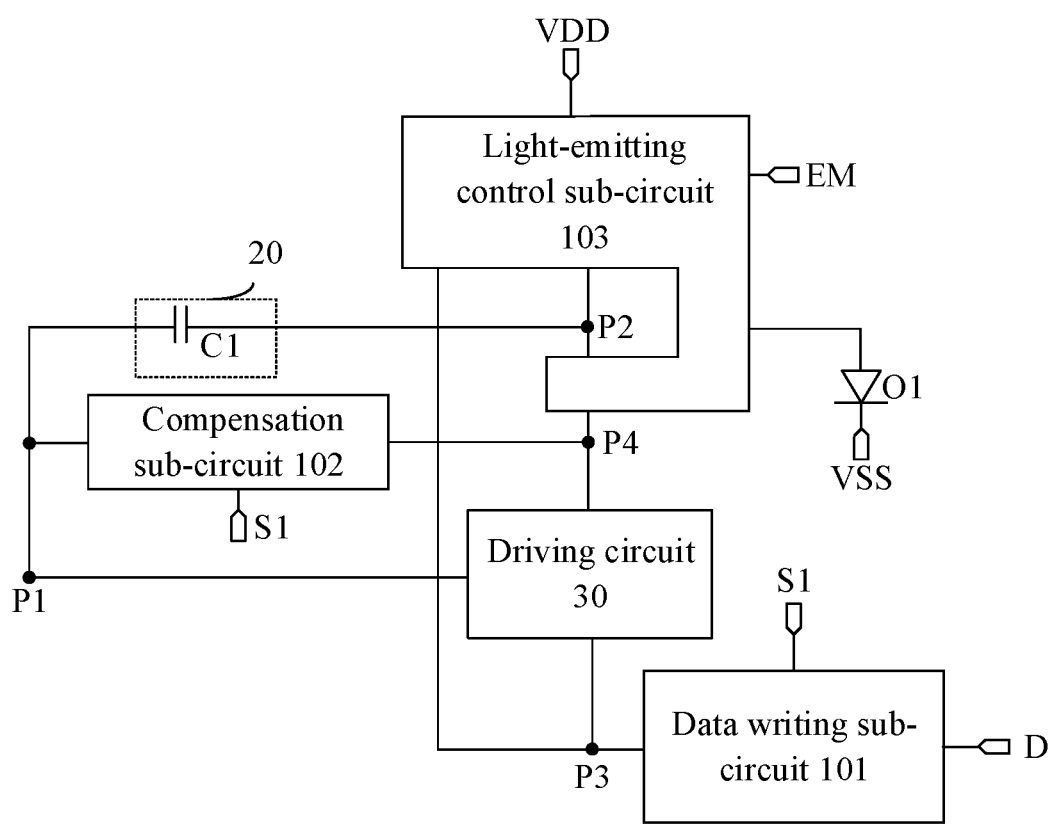
FIG. 2 is a schematic structural diagram of another pixel circuit according to an embodiment of the present disclosure.

Optionally, FIG. 2 is a schematic structural diagram of another pixel circuit according to an embodiment of the present disclosure. As shown in FIG. 2, the compensation circuit 20 may include: a storage capacitor C1.

One end of the storage capacitor C1 may be connected to the first node P1, and the other end of the storage capacitor C1 may be connected to the second node P2. Correspondingly, the storage capacitor C1 may adjust the potential of the first node P1 according to the potential of the second node P2 through a coupling effect.

As shown in FIG. 2, the light-emitting control circuit 10 may include: a data writing sub-circuit 101, a compensation sub-circuit 102 and a light-emitting control sub-circuit 103.

The data writing sub-circuit 101 may be connected to the first scan signal terminal S1, the data signal terminal D, and the third node P3 respectively. The data writing sub-circuit 101 may output a data signal to the third node P3 in response to the first scan signal.

Exemplarily, the data writing sub-circuit 101 may output the data signal to the third node P3 when the potential of the first scan signal is the first potential.

The compensation sub-circuit 102 may be connected to the first scan signal terminal S1, the first node P1, and the fourth node P4, respectively. The compensation sub-circuit 102 may control switching-on and switching-off between the first node P1 and the fourth node P4 in response to the first scan signal, and the fourth node P4 may also be connected to a first electrode of the driving transistor T1 in the driving circuit 30.

Exemplarily, the compensation sub-circuit 102 may control the first node P1 to be conductive with the fourth node P4 when the potential of the first scan signal is the first potential. Correspondingly, the compensation sub-circuit 102 may write the threshold voltage of the driving transistor included in the driving circuit 30 to the first node P1, thereby further enabling the driving signal output by the driving circuit 30 to be independent of the threshold voltage of the driving transistor T1. The problem of uneven display brightness due to the threshold voltage is avoided, and the display effect of the display panel is further improved.

The light-emitting control sub-circuit 103 may be respectively connected to the light-emitting control signal terminal EM, the direct current power terminal VDD, the second node P2, the third node P3, the fourth node P4 and the light-emitting element O1. The light-emitting control sub-circuit 103 may output a direct current power signal to the second node P2 in response to the light-emitting control signal, control switching-on and switching-off between the second node P2 and the fourth node P4, and control switching-on and switching-off between the third node P3 and the light-emitting element O1.

Exemplarily, the light-emitting control sub-circuit 103 may output the direct current power signal to the second node P2 when the potential of the light-emitting control signal is the first potential, control the second node P2 to be conductive with the fourth node P4, and control the third node P3 to be conductive with the light-emitting element O1.

Figure 3:
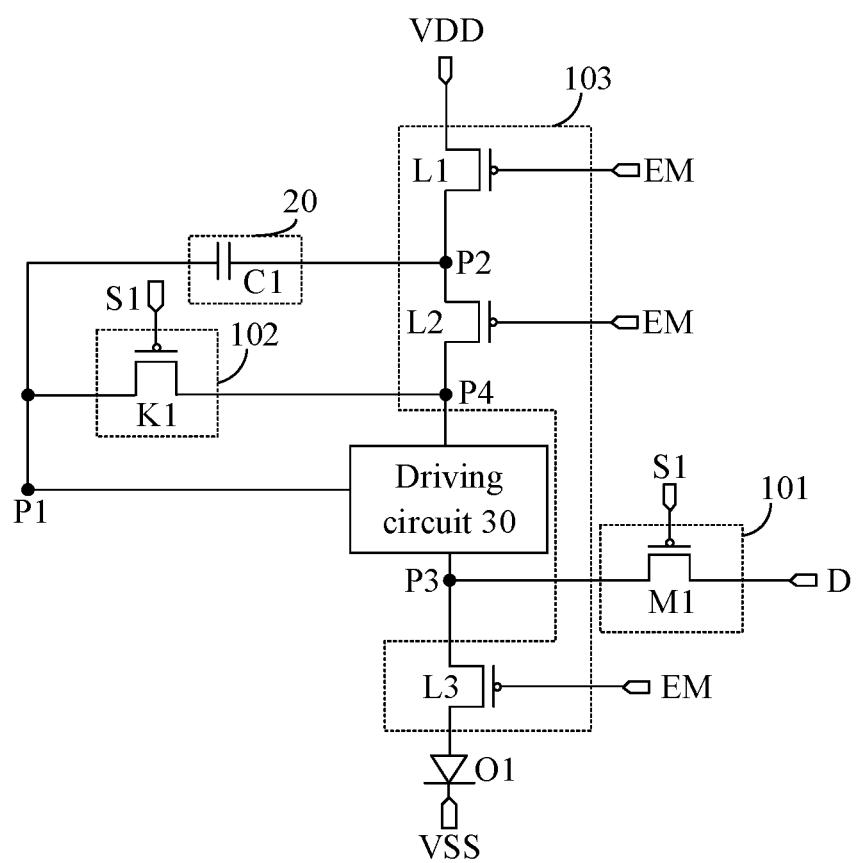
FIG. 3 is a schematic structural diagram of yet another pixel circuit according to an embodiment of the present disclosure.

FIG. 3 is a schematic structural diagram of yet another pixel circuit according to an embodiment of the present disclosure. As shown in FIG. 3, the data writing sub-circuit 101 may include: a data writing transistor M1.

A gate of the data writing transistor M1 may be connected to the first scan signal terminal S1, a first electrode of the data writing transistor M1 may be connected to the data signal terminal D, and a second electrode of the data writing transistor M1 may be connected to the third node P3.

Optionally, referring to FIG. 3, the compensation sub-circuit 102 may include a compensation transistor K1.

A gate of the compensation transistor K1 may be connected to the first scan signal terminal S1, a first electrode of the compensation transistor K1 may be connected to the first node P1, and a second electrode of the compensation transistor K1 may be connected to the fourth node P4.

Optionally, referring to FIG. 3, the light-emitting control sub-circuit 103 may include: a first light-emitting control transistor L1, a second light-emitting control transistor L2, and a third light-emitting control transistor L3.

A gate of the first light-emitting control transistor L1 may be connected to the light-emitting control signal terminal EM, a first electrode of the first light-emitting control transistor L1 may be connected to the direct current power terminal VDD, and a second electrode of the first light-emitting control transistor L1 may be connected to the second node P2.

A gate of the second light-emitting control transistor L2 may be connected to the light-emitting control signal terminal EM, a first electrode of the second light-emitting control transistor L2 may be connected to the second node P2, and a second electrode of the second light-emitting control transistor L2 may be connected to the fourth node P4.

A gate of the third light-emitting control transistor L3 may be connected to the light-emitting control signal terminal EM, a first electrode of the third light-emitting control transistor L3 may be connected to the third node P3, and a second electrode of the third light-emitting control transistor L3 may be connected to the light-emitting element O1.

Figure 4:
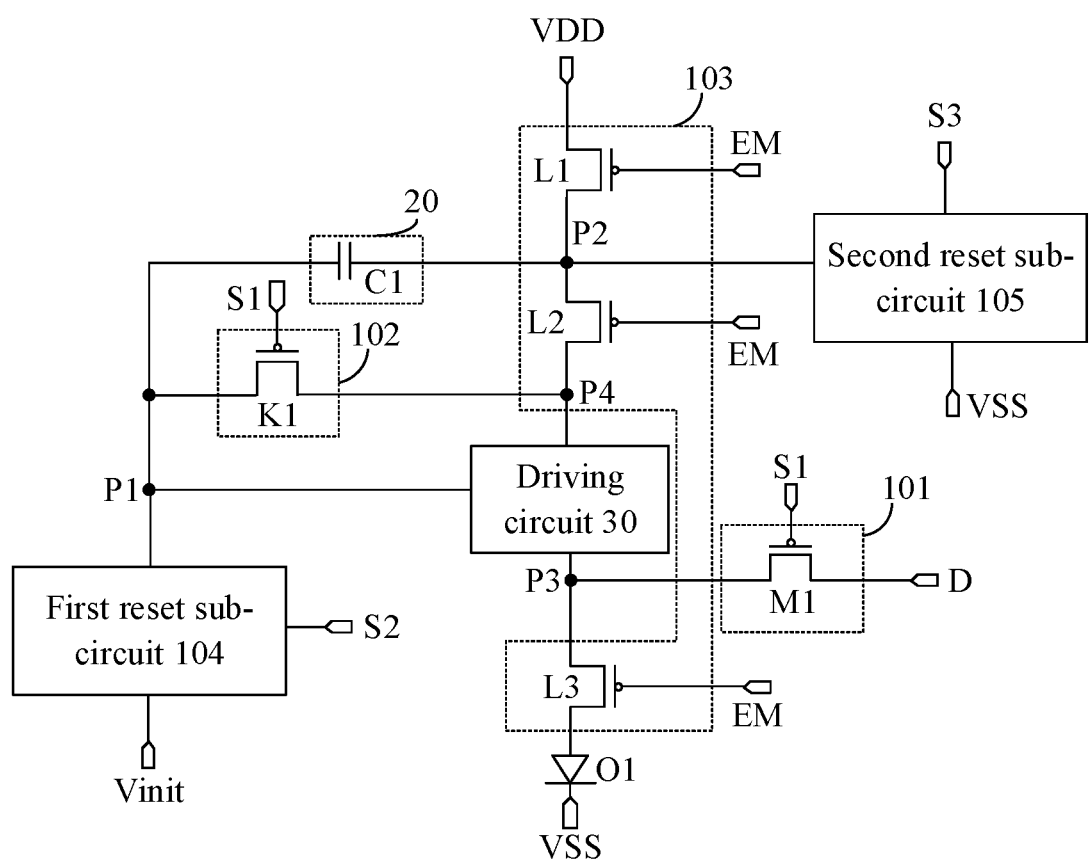
FIG. 4 is a schematic structural diagram of still another pixel circuit according to an embodiment of the present disclosure.

FIG. 4 is a schematic structural diagram of still another pixel circuit according to an embodiment of the present disclosure. As shown in FIG. 4, the light-emitting control circuit 10 may further include: a first reset sub-circuit 104 and a second reset sub-circuit 105.

The first reset sub-circuit 104 may be connected to a second scan signal terminal S2, an initial power terminal Vinit, and the first node P1 respectively. The first reset sub-circuit 104 may output an initial power signal provided by the initial power terminal Vinit to the first node P1 in response to a second scan signal provided by the second scan signal terminal S2.

Exemplarily, the first reset sub-circuit 104 may output the initial power signal provided by the initial power terminal Vinit to the first node P1 when the potential of the second scan signal is the first potential, and a potential of the initial power signal may be the first potential.

Since the first reset sub-circuit 104 can output the initial power signal of the first potential to the first node P1, it can be ensured that each driving circuit 30 starts working from the same bias voltage state, thereby further improving the display effect of the display panel.

The second reset sub-circuit 105 may be connected to a third scan signal terminal S3, a reset power terminal VSS, and the second node P2 respectively. The second reset sub-circuit 105 may output a reset power signal provided by the reset power terminal VSS to the second node P2 in response to a third scan signal provided by the third scan signal terminal S3.

Exemplarily, the second reset sub-circuit 105 may output the reset power signal provided by the reset power terminal VSS to the second node P2 when the potential of the third scan signal is the first potential, and a potential of the reset power signal may be zero.

Figure 5:
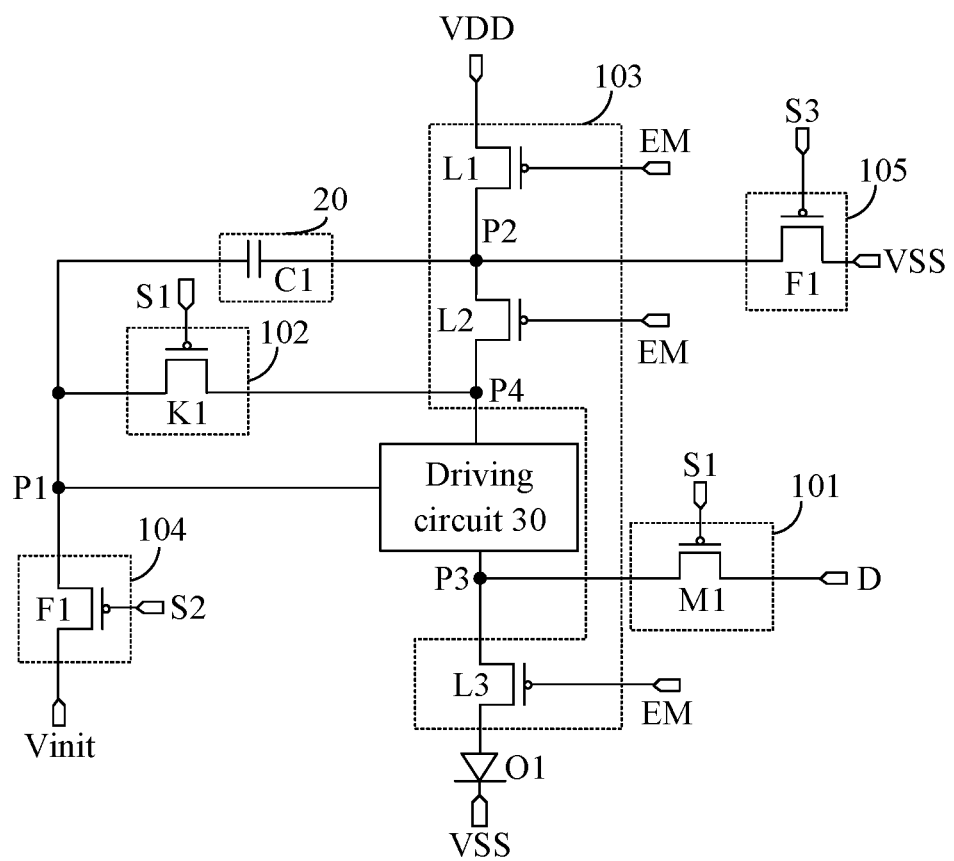
FIG. 5 is a schematic structural diagram of yet still another pixel circuit according to an embodiment of the present disclosure.

FIG. 5 is a schematic structural diagram of yet still another pixel circuit according to an embodiment of the present disclosure. As shown in FIG. 5, the first reset sub-circuit 104 may include: a first reset transistor F1.

A gate of the first reset transistor F1 may be connected to the second scan signal terminal S2, a first electrode of the first reset transistor F1 may be connected to the initial power terminal Vinit, and a second electrode of the first reset transistor F1 may be connected to the first node P1.

Optionally, referring to FIG. 5, the second reset sub-circuit 105 may include: a second reset transistor F2.

A gate of the second reset transistor F2 may be connected to the third scan signal terminal S3, a first electrode of the second reset transistor F2 may be connected to the reset power terminal VSS, and a second electrode of the second reset transistor F2 may be connected to the second node P2.

FIG. 6 is a schematic structural diagram of yet still another pixel circuit according to an embodiment of the present disclosure. As shown in FIG. 6, the driving circuit 30 may include: a driving transistor T1.

A gate of the driving transistor T1 may be connected to the first node P1, a first electrode of the driving transistor T1 may be connected to the second node P2, and a second electrode of the driving transistor T1 may be connected to the third node P3. The first electrode of the driving transistor T1 may be directly connected to the fourth node P4, and further may be connected to the second node P2 through the second light-emitting control transistor L2.

It can be seen from FIG. 2 to FIG. 6 that the light-emitting element O1 may also be connected to the reset power terminal VSS, and the potential of the reset power signal provided by the reset power terminal VSS may be a third potential, for example, 0. In addition, the third potential may be a high potential relative to the first potential, and the third potential may be a low potential relative to the second potential.

It should be noted that in the above embodiment, the condition that each transistor is a P-type transistor, and the first potential is a low potential relative to the second potential is taken as an example for illustration. Of course, the respective transistors may also be N-type transistors. When the respective transistors are N-type transistors, the first potential may be a high potential relative to the second potential.

In summary, the embodiment of the present disclosure provides a pixel circuit. The pixel circuit includes the light-emitting control circuit, the compensation circuit, and the driving circuit. The light-emitting control circuit can output the direct current power signal provided by the direct current power terminal to the second node, and control the third node to be conductive with the light-emitting element, and the compensation circuit can adjust the potential of the first node according to the potential of the second node. Therefore, when the pixel circuit is driven, the potential finally written to the first node is only related to a threshold voltage of the driving transistor, the potential of the data signal provided by the data signal terminal, and the potential of the second node. Moreover, the driving signal output by the driving circuit is related to the potential difference between the first node and the second node, so that the driving signal output by the driving circuit is independent of the potential of the second node, that is, independent of the direct current power signal, thereby avoiding the problem of uneven display brightness of the display panel due to the voltage drop of the direct current power terminal. The pixel circuit provided by the embodiment of the present disclosure can ensure a better display effect of the display panel.

FIG. 7 is a flowchart of a driving method for a pixel circuit according to an embodiment of the present disclosure, which may be applied to the pixel circuit shown in any one of FIG. 1 to FIG. 6. As shown in FIG. 7, the method may include:

In step 401, in a data writing stage, the potential of a first scan signal provided by a first scan signal terminal is a first potential, a light-emitting control circuit controls the potential of a first node according to a data signal provided by a data signal terminal in response to the first scan signal.

In step 402, in a light-emitting stage, the potential of a light-emitting control signal provided by a light-emitting control signal terminal is the first potential, the light-emitting control circuit outputs a direct current power signal provided by a direct current power terminal to a second node in response to the light-emitting control signal, and controls a third node to be conductive with a light-emitting element, a compensation circuit adjusts the potential of the first node according to a potential of the second node, and a driving circuit outputs a driving signal to the third node in response to the potential of the first node and the potential of the second node.

In summary, the embodiment of the present disclosure provides a driving method for a pixel circuit. In the light-emitting stage, the light-emitting control circuit can output the direct current power signal provided by the direct current power terminal to the second node, or control the third node to be conductive with the light-emitting element, and the compensation circuit can adjust the potential of the first node according to the potential of the second node. Therefore, when the pixel circuit is driven, the potential finally written to the first node is only related to a threshold voltage of the driving transistor, the potential of the data signal provided by the data signal terminal, and the potential of the second node. Moreover, the driving signal output by the driving circuit is related to the potential difference between the first node and the second node, so that the driving signal output by the driving circuit is independent of the potential of the second node, that is, independent of the direct current power signal, thereby avoiding the problem of uneven display brightness of the display panel due to the voltage drop of the direct current power terminal. The pixel circuit provided by the embodiment of the present disclosure can ensure a better display effect of the display panel.

Optionally, referring to FIG. 2 to FIG. 6, the light-emitting control circuit 10 may include: a data writing sub-circuit 101, a compensation sub-circuit 102 and a light-emitting control sub-circuit 103.

Correspondingly, the above step 401 may include: in the data writing stage, the potential of the first scan signal is the first potential. The data signal terminal D may output a data signal to the first node P1 through the data writing sub-circuit 101, the driving circuit 30 and the compensation sub-circuit 102.

The above step 402 may include: in the light-emitting stage, the potential of the light-emitting control signal is the first potential, the direct current power terminal VDD may output the direct current power signal to the second node P2 through the light-emitting control sub-circuit 103, the second node P2 is conductive with the fourth node P4, and the third node P3 is conductive with the light-emitting element O1.

Optionally, referring to FIG. 4 to FIG. 6, the light-emitting control circuit 10 may further include: a first reset sub-circuit 104 and a second reset sub-circuit 105. The first reset sub-circuit 104 may be respectively connected to the second scan signal terminal S2, the initial power terminal Vinit and the first node P1. The second reset sub-circuit 105 is respectively connected to the third scan signal terminal S3, the reset power terminal VSS and the second node P2.

Figure 8:
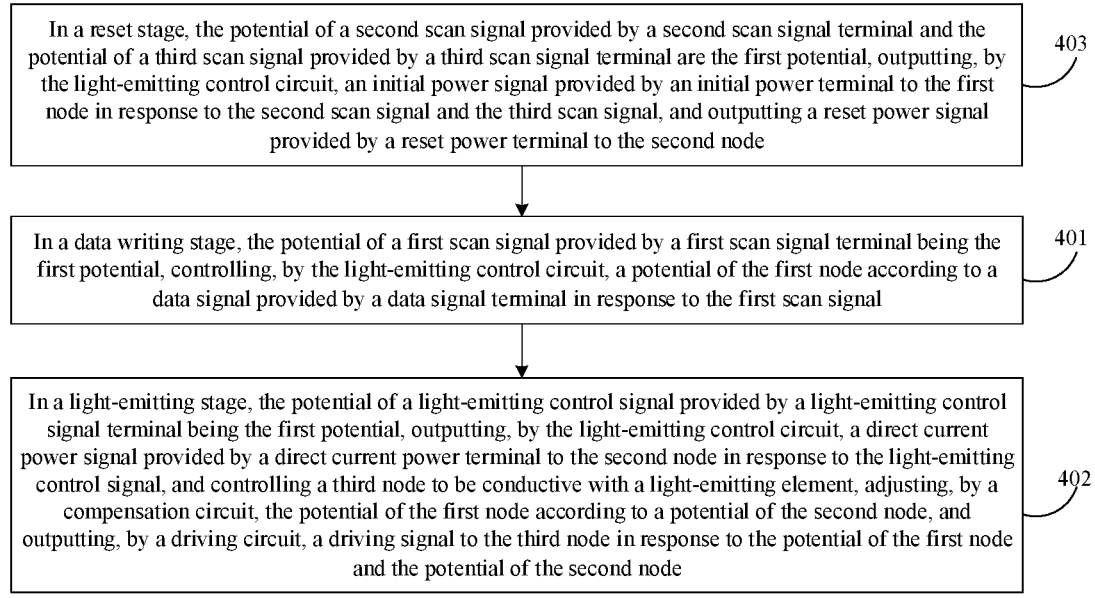
FIG. 8 is a flowchart of another driving method for a pixel circuit according to an embodiment of the present disclosure.

Correspondingly, referring to FIG. 8, before the data writing stage, that is, before the above step 401, the method may further include:

In step 403, in a reset stage, the potential of a second scan signal provided by the second scan signal terminal and the potential of a third scan signal provided by the third scan signal terminal are the first potential, and the light-emitting control circuit outputs an initial power signal provided by the initial power terminal to the first node in response to the second scan signal and the third scan signal, and outputs a reset power signal provided by the reset power terminal to the second node.

For example, the first reset sub-circuit 104 may output the initial power signal provided by the initial power terminal to the first node in response to the second scan signal. The second reset sub-circuit 105 may output the reset power signal provided by the reset power terminal to the second node in response to the third scan signal.

In addition, in the data writing stage shown in the above step 402, a potential of the third scan signal provided by the third scan signal terminal is also the first potential, and the second reset sub-circuit 105 in the light-emitting control circuit may output the reset power signal to the second node in response to the third scan signal.

A potential of the initial power signal is the first potential.

Since the pixel circuit may also output the initial power signal of the first potential to the first node P1 before the data writing stage, it can be ensured that the driving transistors included in each driving circuit all start to work from the same bias voltage state, and the display effect of the display panel is further improved.

By taking the pixel circuit shown in FIG. 6 as an example, and the condition that the transistors in the pixel circuit are P-type transistors, the potential of the initial power signal provided by the initial power terminal Vint is the first potential, the potential of the direct current power signal provided by the direct current power terminal VDD is the second potential, and the first potential is a low potential relative to the second potential as an example, a drive principle of the pixel circuit provided by the embodiment of the present disclosure is described in detail.

Figure 9:
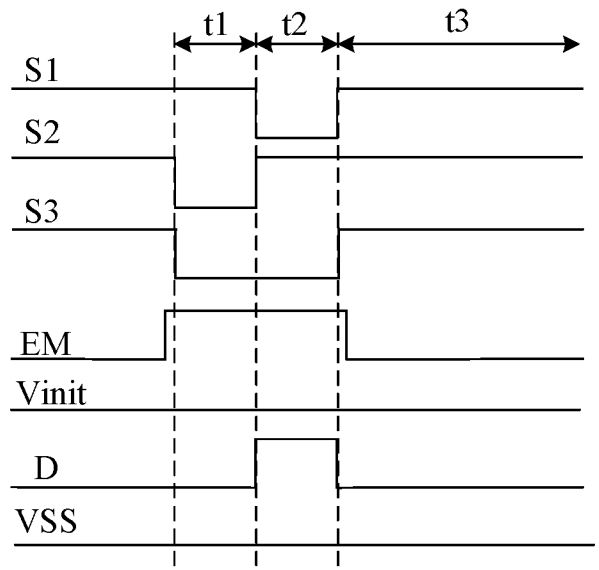
FIG. 9 is a timing diagram of signals of signal terminals in a pixel circuit according to an embodiment of the present disclosure.

FIG. 9 is a timing diagram of signals of signal terminals in a pixel circuit according to an embodiment of the present disclosure. As shown in FIG. 9, in the reset stage t1, the potential of the second scan signal provided by the second scan signal terminal S2 and the potential of the third scan signal provided by the third scan signal terminal S3 are both the first potential, and the first reset transistor F1 is conductive with the second reset transistor F2. The initial power terminal Vinit outputs the initial power signal of the first potential to the first node P1 through the first reset transistor F1 to reset the first node P1, and the driving transistor T1 is switched on. The reset power terminal VSS outputs the reset power signal to the second node P2 through the second reset transistor F2 to reset the second node P2. Assuming that the potential Vss of the reset power signal is zero, then the potential of the second node P2 is zero.

Figure 10:
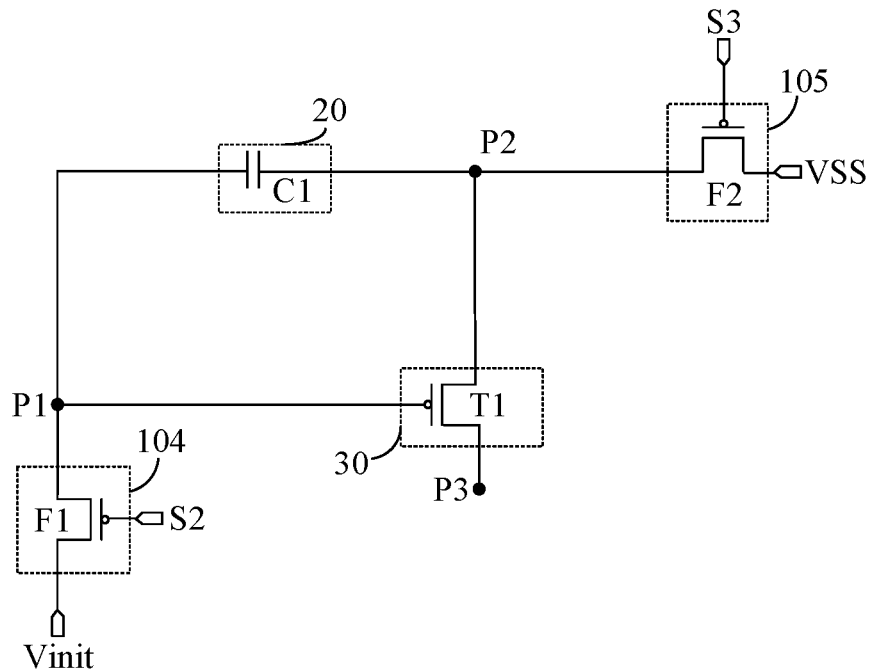
FIG. 10 is an equivalent circuit diagram of a pixel circuit in a reset stage according to an embodiment of the present disclosure.

In addition, in the reset stage t1, as shown in FIG. 9, the potential of the first scan signal provided by the first scan signal terminal S1 and the potential of the light-emitting control signal provided by the light-emitting control signal terminal EM are both the second potential, the data writing transistor M1, the compensation transistor K1, the first light-emitting control transistor L1, the second light-emitting control transistor L2, and the third light-emitting control transistor L3 are all switched off, and the light-emitting element O1 does not emit light. The equivalent circuit diagram of the pixel circuit in the reset stage t1 may refer to FIG. 10.

In the data writing stage t2, the potential of the second scan signal jumps to the second potential, and the first reset transistor F1 is switched off. The potential of the third scan signal remains the first potential, and the second reset transistor F2 remains to be switched on. The potential of the first scan signal jumps to the first potential, and the compensation transistor K1 and the data writing transistor M1 are switched on. The driving transistor T1 is switched on in the reset stage t1, so that the data signal terminal D can output the data signal to the first node P1 through the data writing transistor M1, the driving transistor T1, and the compensation transistor K1 in the data writing stage t2 until the potential of the first node P1 becomes: Vdata+Vth, wherein Vdata is a potential of the data signal, Vth is a threshold voltage of the driving transistor T1, and Vth is less than zero. Moreover, since the second reset transistor F2 is switched on, the potential of the second node P2 can remain to be Vss.

Figure 11:
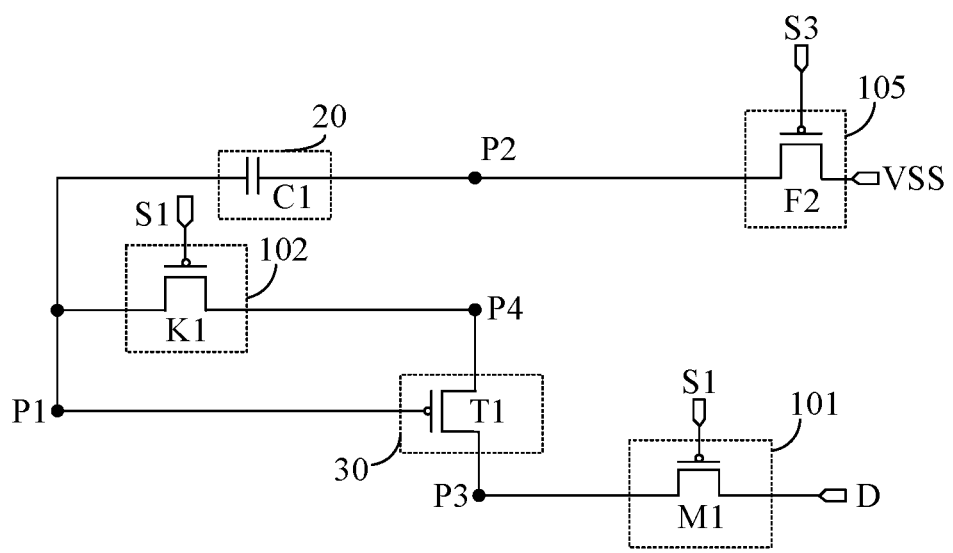
FIG. 11 is an equivalent circuit diagram of a pixel circuit in a data writing stage according to an embodiment of the present disclosure.

In addition, in the data writing stage t2, the potential of the light-emitting control signal remains the second potential, the first light-emitting control transistor L1, the second light-emitting control transistor L2, and the third light-emitting control transistor L3 are all switched off, and the light-emitting element O1 still does not emit light. The equivalent circuit diagram of the pixel circuit in the data writing stage t2 may refer to FIG. 11.

In the light-emitting stage t3, the potential of the first scan signal and the potential of the third scan signal are both the second potential. For example, the potential of the first scan signal firstly jumps to the second potential, so that the data writing transistor M1 and the compensation transistor K1 are switched off. Then, the potential of the third scan signal jumps to the second potential, so that the second reset transistor F2 is switched off. Besides, as shown in FIG. 9, in the light-emitting stage t3, the potential of the light-emitting control signal provided by the light-emitting control signal terminal EM jumps to the first potential, the first light-emitting control transistor L1, the second light-emitting control transistor L2, and the third light-emitting control transistor L3 are switched on, the second node P2 and the fourth node P3 are switched on, and the third node P3 and the light-emitting element O1 are switched on. The direct current power terminal VDD may output a direct current power signal to the second node P2 through the first light-emitting control transistor L1, and then output the direct current power signal to the fourth node P4 through the second light-emitting control transistor L2.

Figure 12:
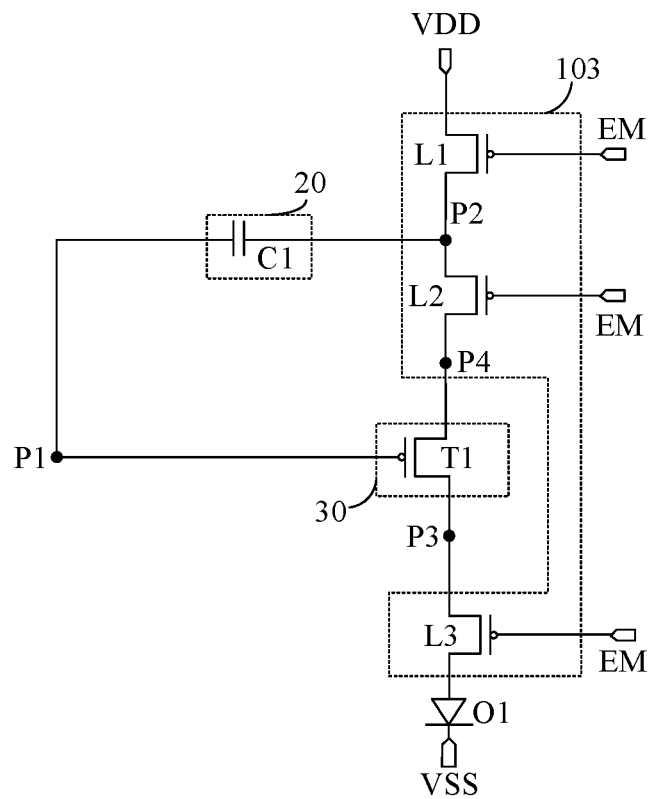
FIG. 12 is an equivalent circuit diagram of a pixel circuit in a light-emitting stage according to an embodiment of the present disclosure.

Assuming that the potential of the direct current power signal is Vdd, then the potentials of the second node P2 and the fourth node P4 become Vdd. A source and a drain of the driving transistor T1 are the same in a manufacturing procedure (i.e., a manufacturing process), so that at this time, the fourth node P4 may be used as the source of the driving transistor T1, and correspondingly, the source potential Vs of the driving transistor T1 may become Vdd. Since the potential of the second node P2 is Vss in the data writing stage t2, it can be determined that the potential change of the second node P2 is Vdd−Vss in the light-emitting stage t3. Since the compensation transistor K1 is switched off, the potential of the first node P1 (that is, the gate of the driving transistor T1) can become: Vdd−Vss+Vdata+Vth under a coupling effect of the storage capacitor C1 in the light-emitting stage t3, and the driving transistor T1 is switched on. The equivalent circuit diagram of the pixel circuit in the light-emitting stage t3 may refer to FIG. 12.

In the light-emitting stage t3, the driving transistor T1 may output a driving signal to the third node P3 according to the potential of the first node P1 and the potential of the second node P2, so as to drive the light-emitting element O1 to emit light.

In the light-emitting stage t3, the gate potential Vg of the driving transistor T1 is: Vdd−Vss+Vdata+Vth, and the source potential Vs of the driving transistor T1 is Vdd, so that the gate-source potential difference Vgs of the driving transistor T1 may satisfy: Vgs=Vg−Vs=Vdd−Vss+Vdata+Vth−Vdd=Vdata+Vth−Vss.

In the embodiment of the present disclosure, a driving current $I_{OLED}$ generated by the driving transistor T1 may satisfy:

$$I_{OLED}=\beta \times (Vgs-Vth)^2 \qquad \text{Formula (1)}.$$

β satisfies:

$$\beta = \frac{1}{2}\mu_n C_{ox}\left(\frac{W}{L}\right),$$

wherein $\mu_n$ is a carrier mobility of the driving transistor T1, $C_{OX}$ is the capacitance of a gate insulating layer of the driving transistor T1, W/L is an aspect ratio of the driving transistor T1, and β is a constant after the display panel manufacturing process is determined.

The gate-source potential difference Vgs calculated above is substituted into formula (1), and the driving current $I_{OLED}$ output by the driving transistor T1 may be calculated as:

$$I_{OLED}=\beta \times (Vgs-Vth)^2=\beta(V\text{data}-Vss)^2 \qquad \text{Formula (2)}.$$

It can be seen from formula (2) that for the pixel circuit shown in FIG. 6, when the light-emitting element O1 works normally, the size of the driving current $I_{OLED}$ used to drive the light-emitting element O1 is only related to β, the data signal provided by the data signal terminal D and the reset power signal provided by the reset power terminal VSS, and is independent of the threshold voltage Vth of the driving transistor T1 and the direct current power signal provided by the direct current power terminal VDD. If the potential of the reset power signal provided by the reset power terminal VSS is 0, the size of the driving current $I_{OLED}$ is only related to β and the data signal provided by the data signal terminal D. Therefore, not only the problem of poor display brightness uniformity of the display panel due to the voltage drop of the direct current power terminal VDD can be solved, but also the problem of poor display brightness uniformity of the display panel due to drifting of the threshold voltage Vth of the driving transistor is avoided, thereby ensuring the brightness uniformity of the display panel.

In summary, the embodiment of the present disclosure provides a driving method for a pixel circuit. In the light-emitting stage, the light-emitting control circuit can output the direct current power signal provided by the direct current power terminal to the second node, or control the third node to be conductive with the light-emitting element, and the compensation circuit can adjust the potential of the first node according to the potential of the second node. Therefore, when the pixel circuit is driven, the potential finally written to the first node is only related to the threshold voltage of the driving transistor, the potential of the data signal provided by the data signal terminal, and the potential of the second node. Moreover, the driving signal output by the driving circuit is related to the potential difference between the first node and the second node, so that the driving signal output by the driving circuit is independent of the potential of the second node, that is, independent of the direct current power signal, thereby avoiding the problem of uneven display brightness of the display panel due to the voltage drop of the direct current power terminal. A display effect of the display panel is improved.

Figure 13:
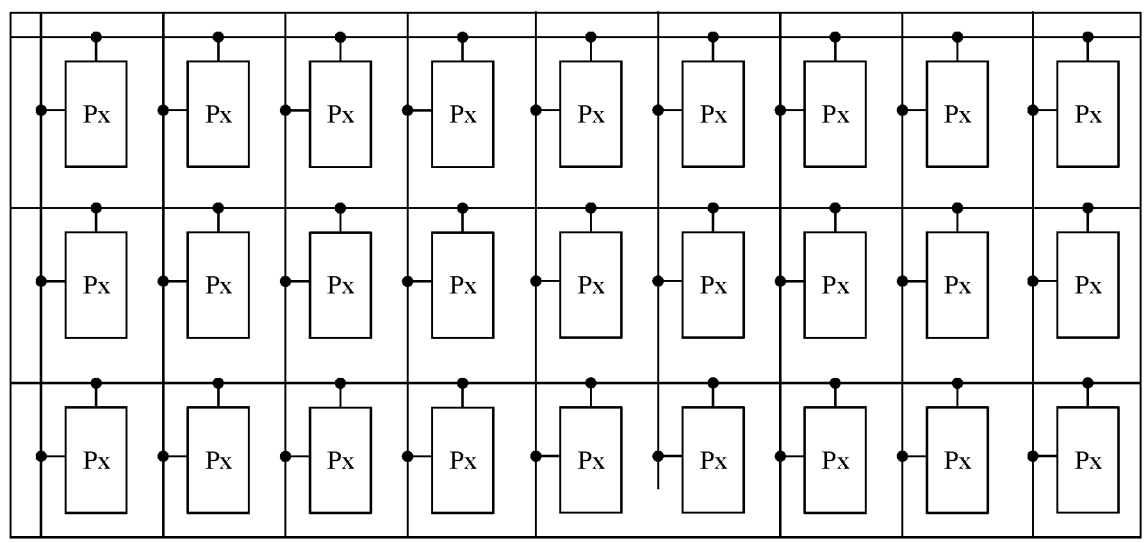
FIG. 13 is a schematic structural diagram of a display substrate according to an embodiment of the present disclosure.

An embodiment of the present disclosure provides a display substrate. As shown in FIG. 13, the display substrate may include: a plurality of pixel units px. Each of at least one pixel unit px of the plurality of pixel units px may include a light-emitting element, and the pixel circuit according to the above embodiment connected to the light-emitting element, for example, the pixel circuit as shown in any one of FIG. 1 to FIG. 6.

Optionally, each pixel unit px in the display substrate may include: a light-emitting element, and the pixel circuit according to the above embodiment connected to the light-emitting element. The light-emitting element may be an OLED or AMOLED.

Figure 14:
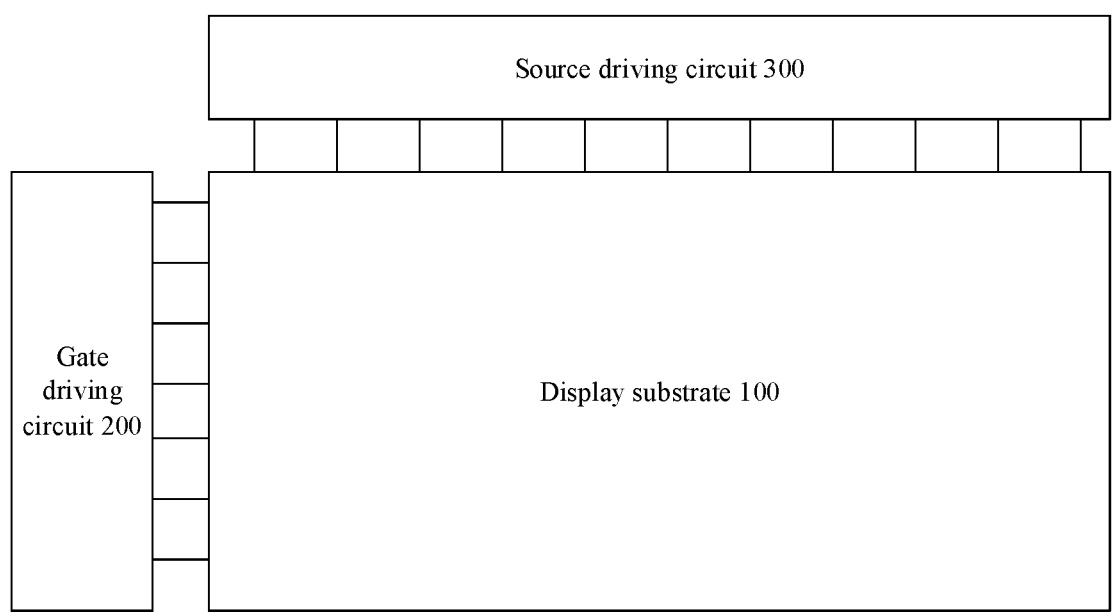
FIG. 14 is a schematic structural diagram of a display device according to an embodiment of the present disclosure.

In addition, an embodiment of the present disclosure also provides a display device. As shown in FIG. 14, the display device may include a driving circuit, and a display substrate 100 according to the above embodiment connected to the driving circuit.

Exemplarily, as shown in FIG. 14, the display device may include a gate driving circuit 200 for providing a scan signal, and a source driving circuit 300 for providing a data signal.

The display device may be any product or component with a display function, such as an OLED display device, an AMOLED display device, a mobile phone, a tablet computer, a television, a monitor, a notebook computer, a digital photo frame and a navigator.

A person skilled in the art may clearly understand that, for the convenience and brevity of the description, as to the specific working process of the foregoing pixel circuit and respective sub-circuits, please refer to the corresponding process in the foregoing method embodiment, and details are not described herein again.

The above are just the optional embodiments of the present disclosure, which will not limit the present disclosure. Any modifications, equivalent replacements and improvements made within the spirits and principles of the present disclosure shall all fall in the protection scope of the present disclosure.

What is claimed is:

1. A pixel circuit, comprising: a light-emitting control circuit, a compensation circuit and a driving circuit; wherein
the light-emitting control circuit is respectively connected to a first scan signal terminal, a light-emitting control signal terminal, a data signal terminal, a direct current power terminal, a first node, a second node, a third node and a light-emitting element, and the light-emitting control circuit is used to control a potential of the first node in response to a first scan signal from the first scan signal terminal and a data signal from the data signal terminal, output a direct current power signal provided by the direct current power terminal to the second node in response to a light-emitting control signal from the light-emitting control signal terminal, and control switching-on and switching-off between the third node and the light-emitting element;
the compensation circuit is respectively connected to the first node and the second node, and the compensation circuit is used to adjust the potential of the first node according to a potential of the second node; and
the driving circuit is respectively connected to the first node, the second node, and the third node, and the driving circuit is used to output a driving signal to the third node in response to the potential of the first node and the potential of the second node;
wherein the light-emitting control circuit comprises: a data writing sub-circuit, a compensation sub-circuit and a light-emitting control sub-circuit;
the data writing sub-circuit is respectively connected to the first scan signal terminal, the data signal terminal and the third node, and the data writing sub-circuit is used to output the data signal to the third node in response to the first scan signal;
the compensation sub-circuit is respectively connected to the first scan signal terminal, the first node and a fourth node, and the compensation sub-circuit is used to control switching-on and switching-off between the first node and the fourth node in response to the first scan signal, wherein the fourth node is also connected to a first electrode of a driving transistor in the driving circuit; and
the light-emitting control sub-circuit is respectively connected to the light-emitting control signal terminal, the direct current power terminal, the second node, the fourth node, the third node and the light-emitting element, and the light-emitting control sub-circuit is used to output the direct current power signal to the second node in response to the light-emitting control signal, control switching-on and switching-off between the second node and the fourth node, and control switching-on and switching-off between the third node and the light-emitting element.

2. The pixel circuit according to claim 1, wherein the compensation circuit comprises: a storage capacitor;
one end of the storage capacitor is connected to the first node, and the other end of the storage capacitor is connected to the second node.

3. The pixel circuit according to claim 1, wherein the driving circuit comprises: a driving transistor; and
a gate of the driving transistor is connected to the first node, a first electrode of the driving transistor is connected to the second node, and a second electrode of the driving transistor is connected to the third node.

4. The pixel circuit according to claim 1, wherein the data writing sub-circuit comprises: a data writing transistor; and
a gate of the data writing transistor is connected to the first scan signal terminal, a first electrode of the data writing transistor is connected to the data signal terminal, and a second electrode of the data writing transistor is connected to the third node.

5. The pixel circuit according to claim 1, wherein the compensation sub-circuit comprises: a compensation transistor; and
a gate of the compensation transistor is connected to the first scan signal terminal, a first electrode of the compensation transistor is connected to the first node, and a second electrode of the compensation transistor is connected to the fourth node.

6. The pixel circuit according to claim 1, wherein the light-emitting control sub-circuit comprises: a first light-emitting control transistor, a second light-emitting control transistor, and a third light-emitting control transistor;
a gate of the first light-emitting control transistor is connected to the light-emitting control signal terminal, a first electrode of the first light-emitting control transistor is connected to the direct current power terminal, and a second electrode of the first light-emitting control transistor is connected to the second node;

a gate of the second light-emitting control transistor is connected to the light-emitting control signal terminal, a first electrode of the second light-emitting control transistor is connected to the second node, and a second electrode of the second light-emitting control transistor is connected to the fourth node; and a gate of the third light-emitting control transistor is connected to the light-emitting control signal terminal, a first electrode of the third light-emitting control transistor is connected to the third node, and a second electrode of the third light-emitting control transistor is connected to the light-emitting element.

7. The pixel circuit according to claim 1, wherein the light-emitting control circuit further comprises: a first reset sub-circuit and a second reset sub-circuit;

the first reset sub-circuit is respectively connected to a second scan signal terminal, an initial power terminal and the first node, and the reset sub-circuit is used to output an initial power signal provided by the initial power terminal to the first node in response to a second scan signal from the second scan signal terminal; and the second reset sub-circuit is respectively connected to the second node, a third scan signal terminal and a reset power terminal, and the second reset sub-circuit is used to output a reset power signal provided by the reset power terminal to the second node in response to a third scan signal from the third scan signal terminal.

8. The pixel circuit according to claim 7, wherein the first reset sub-circuit comprises: a first reset transistor;

a gate of the first reset transistor is connected to the second scan signal terminal, a first electrode of the first reset transistor is connected to the initial power terminal, and a second electrode of the first reset transistor is connected to the first node.

9. The pixel circuit according to claim 7, wherein the second reset sub-circuit comprises: a second reset transistor; and a gate of the second reset transistor is connected to the third scan signal terminal, a first electrode of the second reset transistor is connected to the reset power terminal, and a second electrode of the second reset transistor is connected to the second node.

10. The pixel circuit according to claim 9, wherein the transistors comprised in the pixel circuit are P-type transistors.

11. The pixel circuit according to claim 1, wherein the compensation circuit comprises: a storage capacitor; the driving circuit comprises: a driving transistor; the data writing sub-circuit comprises: a data writing transistor; the compensation sub-circuit comprises: a compensation transistor; the light-emitting control sub-circuit comprises: a first light-emitting control transistor, a second light-emitting control transistor, and a third light-emitting control transistor; and the pixel circuit further comprises a first reset transistor and a second reset transistor; wherein one end of the storage capacitor is connected to the first node, and the other end of the storage capacitor is connected to the second node;

the gate of the driving transistor is connected to the first node, the first electrode of the driving transistor is connected to the fourth node, and the second electrode of the driving transistor is connected to the third node;

the gate of the data writing transistor is connected to the first scan signal terminal, the first electrode of the data writing transistor is connected to the data signal terminal, and the second electrode of the data writing transistor is connected to the third node;

the gate of the compensation transistor is connected to the first scan signal terminal, the first electrode of the compensation transistor is connected to the first node, the second electrode of the compensation transistor is connected to the fourth node, and the fourth node is also connected to the first electrode of the driving transistor;

the gate of the first light-emitting control transistor is connected to the light-emitting control signal terminal, the first electrode of the first light-emitting control transistor is connected to the direct current power terminal, and the second electrode of the first light-emitting control transistor is connected to the second node;

the gate of the second light-emitting control transistor is connected to the light-emitting control signal terminal, the first electrode of the second light-emitting control transistor is connected to the second node, and the second electrode of the second light-emitting control transistor is connected to the fourth node;

the gate of the third light-emitting control transistor is connected to the light-emitting control signal terminal, the first electrode of the third light-emitting control transistor is connected to the third node, and the second electrode of the third light-emitting control transistor is connected to the light-emitting element;

the gate of the first reset transistor is connected to the second scan signal terminal, the first electrode of the first reset transistor is connected to the initial power terminal, and the second electrode of the first reset transistor is connected to the first node;

the gate of the second reset transistor is connected to the third scan signal terminal, the first electrode of the second reset transistor is connected to the reset power terminal, and the second electrode of the second reset transistor is connected to the second node; and the transistors comprised in the pixel circuit are P-type transistors.

12. A driving method for a pixel circuit, applied to the pixel circuit according to claim 1, comprising:

in a data writing stage, the potential of a first scan signal provided by a first scan signal terminal being a first potential, controlling, by a light-emitting control circuit, a potential of a first node according to a data signal provided by a data signal terminal in response to the first scan signal; and in a light-emitting stage, the potential of a light-emitting control signal provided by a light-emitting control signal terminal being the first potential, outputting, by the light-emitting control circuit, a direct current power signal provided by a direct current power terminal to a second node in response to the light-emitting control signal, controlling, by the light-emitting control circuit, switching-on between a third node and a light-emitting element, adjusting, by a compensation circuit, the potential of the first node according to a potential of the second node, and outputting, by a driving circuit, a driving signal to the third node in response to the potential of the first node and the potential of the second node.

13. The method according to claim 12, wherein the light-emitting control circuit comprises: a data writing sub-circuit, a compensation sub-circuit and a light-emitting control sub-circuit;

in the data writing stage, the potential of the first scan signal is the first potential, and the data signal terminal outputs the data signal to the first node through the data writing sub-circuit, the driving circuit and the compensation sub-circuit; and in the light-emitting stage, the potential of the light-emitting control signal is the first potential, the direct current power terminal outputs the direct current power signal to the second node through the light-emitting control sub-circuit, the second node is conductive with the fourth node, and the third node is conductive with the light-emitting element.

14. The method according to claim 13, wherein the light-emitting control circuit further comprises: a first reset sub-circuit and a second reset sub-circuit, the first reset sub-circuit is respectively connected to a second scan signal terminal, an initial power terminal and the first node, and the second reset sub-circuit is respectively connected to the second node, a third scan signal terminal and a reset power terminal; and before the data writing stage, the method further comprises:

in a reset stage, the potential of a second scan signal provided by the second scan signal terminal and the potential of a third scan signal provided by the third scan signal terminal being both the first potential, outputting, by the first reset sub-circuit, an initial power signal provided by the initial power terminal to the first node in response to the second scan signal, and outputting, by the second reset sub-circuit, a reset power signal provided by the reset power terminal to the second node in response to the third scan signal; and in the data writing stage, the potential of the third scan signal provided by the third scan signal terminal being the first potential, outputting, by the second reset sub-circuit, the reset power signal provided by the reset power terminal to the second node in response to the third scan signal;

wherein a potential of the initial power signal is the first potential.

15. The method according to claim 12, wherein a potential of the direct current power signal is a second potential, and the second potential is a high potential relative to the first potential.

16. A display substrate, the display substrate comprising: a plurality of pixel units, wherein in the plurality of pixel units, each of at least one of the pixel units comprises: a light-emitting element, and the pixel circuit, which is connected to the light-emitting element, according to claim 1.

17. The display substrate according to claim 16, wherein the light-emitting element is an organic light-emitting diode.

18. A display device comprising: a driving circuit, and the display substrate according to claim 16.

19. The display device according to claim 18, wherein the compensation circuit comprises: a storage capacitor; the driving circuit comprises: a driving transistor; the data writing sub-circuit comprises: a data writing transistor; the compensation sub-circuit comprises: a compensation transistor; the light-emitting control sub-circuit comprises: a first light-emitting control transistor, a second light-emitting control transistor, and a third light-emitting control transistor; and the pixel circuit further comprises a first reset transistor and a second reset transistor; wherein one end of the storage capacitor is connected to the first node, and the other end of the storage capacitor is connected to the second node;

the gate of the driving transistor is connected to the first node, the first electrode of the driving transistor is connected to the fourth node, and the second electrode of the driving transistor is connected to the third node;

the gate of the data writing transistor is connected to the first scan signal terminal, the first electrode of the data writing transistor is connected to the data signal terminal, and the second electrode of the data writing transistor is connected to the third node;

the gate of the compensation transistor is connected to the first scan signal terminal, the first electrode of the compensation transistor is connected to the first node, the second electrode of the compensation transistor is connected to the fourth node, and the fourth node is also connected to the first electrode of the driving transistor;

the gate of the first light-emitting control transistor is connected to the light-emitting control signal terminal, the first electrode of the first light-emitting control transistor is connected to the direct current power terminal, and the second electrode of the first light-emitting control transistor is connected to the second node;

the gate of the second light-emitting control transistor is connected to the light-emitting control signal terminal, the first electrode of the second light-emitting control transistor is connected to the second node, and the second electrode of the second light-emitting control transistor is connected to the fourth node;

the gate of the third light-emitting control transistor is connected to the light-emitting control signal terminal, the first electrode of the third light-emitting control transistor is connected to the third node, and the second electrode of the third light-emitting control transistor is connected to the light-emitting element;

the gate of the first reset transistor is connected to the second scan signal terminal, the first electrode of the first reset transistor is connected to the initial power terminal, and the second electrode of the first reset transistor is connected to the first node;

the gate of the second reset transistor is connected to the third scan signal terminal, the first electrode of the second reset transistor is connected to the reset power terminal, and the second electrode of the second reset transistor is connected to the second node; and the transistors comprised in the pixel circuit are P-type transistors.

20. The display substrate according to claim 16, wherein each of the pixel units comprises: a light-emitting element, and the pixel circuit, which is connected to the light-emitting element, according to claim 1.

* * * * *